United States Patent [19]

Kurihara

[11] Patent Number: 5,116,454

[45] Date of Patent: May 26, 1992

[54] COVER-TAPE PEELING APPARATUS FOR A TAPE FEEDER

[75] Inventor: Masao Kurihara, Gunma, Japan

[73] Assignee: Sanyo Electric Co., Ltd., Osaka, Japan

[21] Appl. No.: 595,138

[22] Filed: Oct. 10, 1990

[30] Foreign Application Priority Data

Oct. 17, 1989 [JP] Japan .................................. 1-269286

[51] Int. Cl.⁵ .............................................. B32B 31/18
[52] U.S. Cl. ...................................... 156/584; 221/25; 221/26; 221/71; 226/120
[58] Field of Search ................ 156/344, 584; 221/25, 221/26, 71; 226/115, 120

[56] References Cited

U.S. PATENT DOCUMENTS 4,620,655 11/1986 Fujita .............................. 226/115 X
4,735,341 4/1988 Hamilton et al. ........................ 221/1
4,905,370 3/1990 Hineno et al. ......................... 29/740

FOREIGN PATENT DOCUMENTS 63-178593 7/1988 Japan .

Primary Examiner—Michael W. Ball
Assistant Examiner—Mark A. Osele
Attorney, Agent, or Firm—Armstrong, Nikaido, Marmelstein, Kubovcik & Murray

[57] ABSTRACT

The present invention discloses a cover-tape peeling apparatus for a tape feeder for peeling a cover tape released from a tape having a number of chip-like electronic parts sealed therein in a substantially equally spaced relation to wind and receive it into a reel. The apparatus comprises a first arm rotatably supported on a first shaft stood upright on a base of the tape feeder and having a ratchet meshed with a gear tooth formed in the outer peripheral portion of the peeling reel, a second arm having a cam portion in engagement with a cam portion provided on the first arm and rotatably supported on a second shaft, an arm push-down member in contact with the second arm to push down and rotate the second arm, and an urging body extended between both the arms and for rotating the first arm in response to the rotation of the second arm rotated by the arm push-down member so that the peeling reel is rotated through the ratchet.

1 Claim, 21 Drawing Sheets

COVER-TAPE PEELING APPARATUS FOR A TAPE FEEDER

BACKGROUND OF THE INVENTION

1. Field of the Invention

The present invention relates to a cover-tape peeling apparatus for a tape feeder for peeling a cover tape released from a tape having a number of chip-like electronic parts sealed therein in a substantially equally spaced relation to wind and receive it into a reel.

2. Description of the Prior Art

As the prior art of this kind, Japanese Patent Application Laid-Open (Kokai) No. 63(1988)-178,593 discloses an apparatus comprising a supply section for supplying a taping part having received therein chip-like electronic parts in a given pitch to a part of a frame body, and a peeling section for peeling a cover tape for the taping part supplied from said supply section from a carrier tape, said frame body including a cover tape winding section provided with a reel for winding the peeled cover tape and a carrier tape feeding section for feeding the carrier tapes in a given pitch, said frame body being provided with a lever oscillated by a drive source, said lever having the cover tape winding section and a ratchet mechanism of the carrier tape feeding section connected thereto through a link so that said parts are continuously supplied to a mounting head. The technique using the link is disclosed also in the specification and drawings of U.S. Pat. No. 4,735,341.

In the electronic parts supplying apparatus, the width of the whole apparatus becomes thick through a portion of thickness of the link for connecting the cover tape winding section and the ratchet mechanism of the carrier tape supplying section. Many electronic parts supplying apparatuses are originally placed on a horizontal moving table. The thickness of the aforementioned link increases according to the number of the apparatuses. Naturally, the horizontal moving table increases in length and as a result, the body of apparatus for automatically mounting electronic parts inevitably increases in size.

SUMMARY OF THE INVENTION

It is therefore an object of the present invention to design an electronic part supplying apparatus without relying upon the aforementioned connecting construction using the link to make it relatively light in weight and to render substantially constant a quantity of cover tape to be wound at the cover tape winding section.

According to the present invention, there is provided a cover-tape peeling apparatus for a tape feeder for peeling a cover tape released from a tape having a number of chip-like electronic parts sealed therein in a substantially equally spaced relation to wind and receive it into a reel, the apparatus comprising a first arm rotatably supported on a first shaft stood upright on a base of said tape feeder and having a ratchet meshed with a gear tooth formed in the outer peripheral portion of said peeling reel, a second arm having a cam portion in engagement with a cam portion provided on said first arm and rotatably supported on a second shaft, an arm push-down member in contact with said second arm to push down and rotate the second arm, and an urging body extended between both said arms and for rotating the first arm in response to the rotation of said second arm rotated by said arm push-down member so that said peeling reel is rotated through the ratchet.

According to the aforementioned configuration, when the second arm is pushed down by the arm push-down member, the first arm is pulled by the urging body extended between the first arm and the second arm. The first arm is then rotated by engagement of the cams which are provided on the first arm and the second arm, respectively, and the peeling reel is rotated through the ratchet of the first arm.

DETAILED DESCRIPTION OF THE PREFERRED EMBODIMENTS

Figure 1:
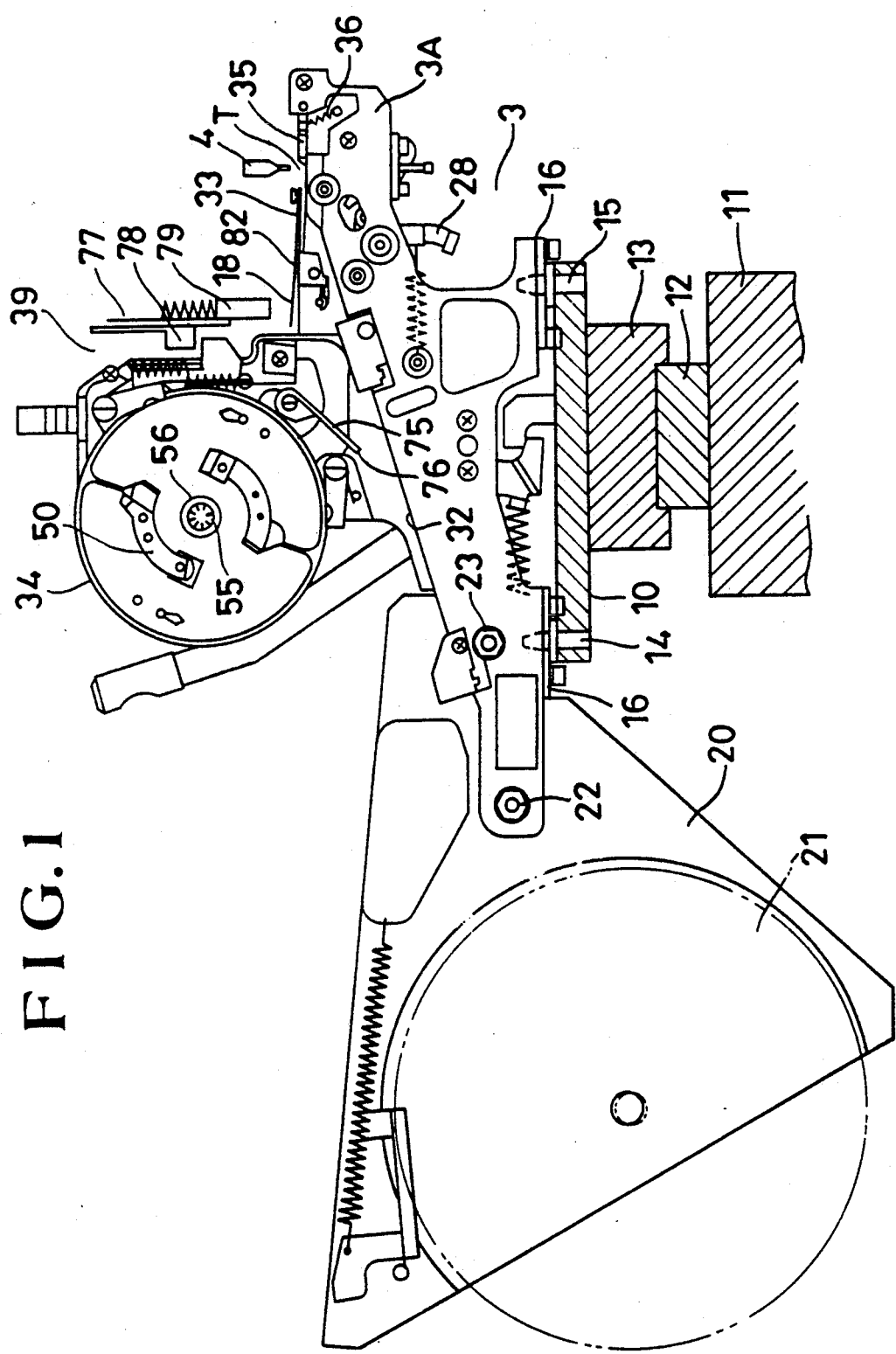
FIG. 1 is a front view of a tape feeder.
Figure 2:
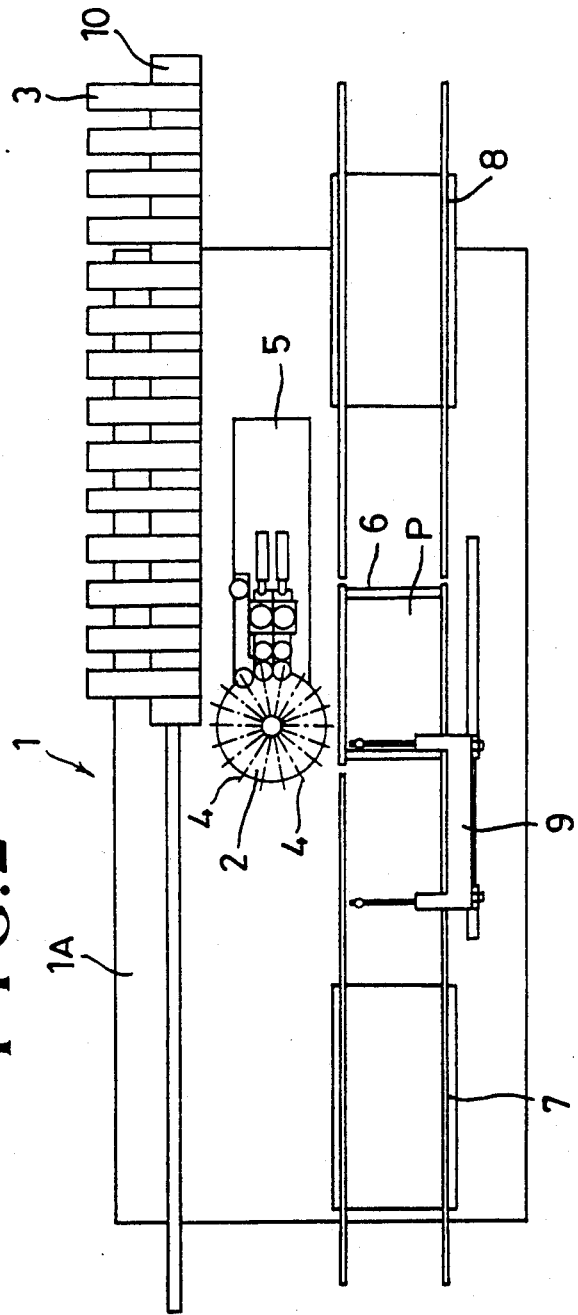
FIG. 2 is a plan view of an apparatus for automatically mounting electronic parts.
Figure 3:
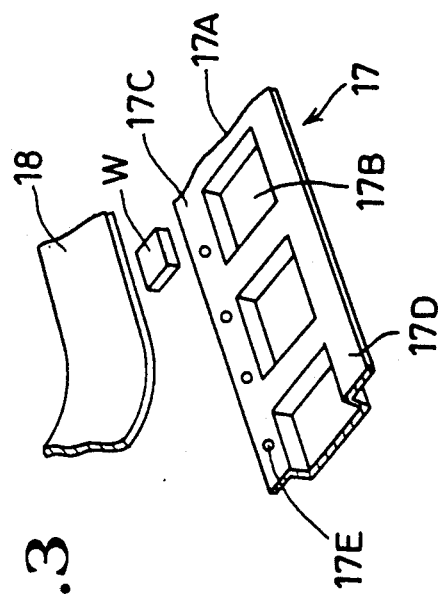
FIG. 3 is an exploded view of a tape.
Figure 4:
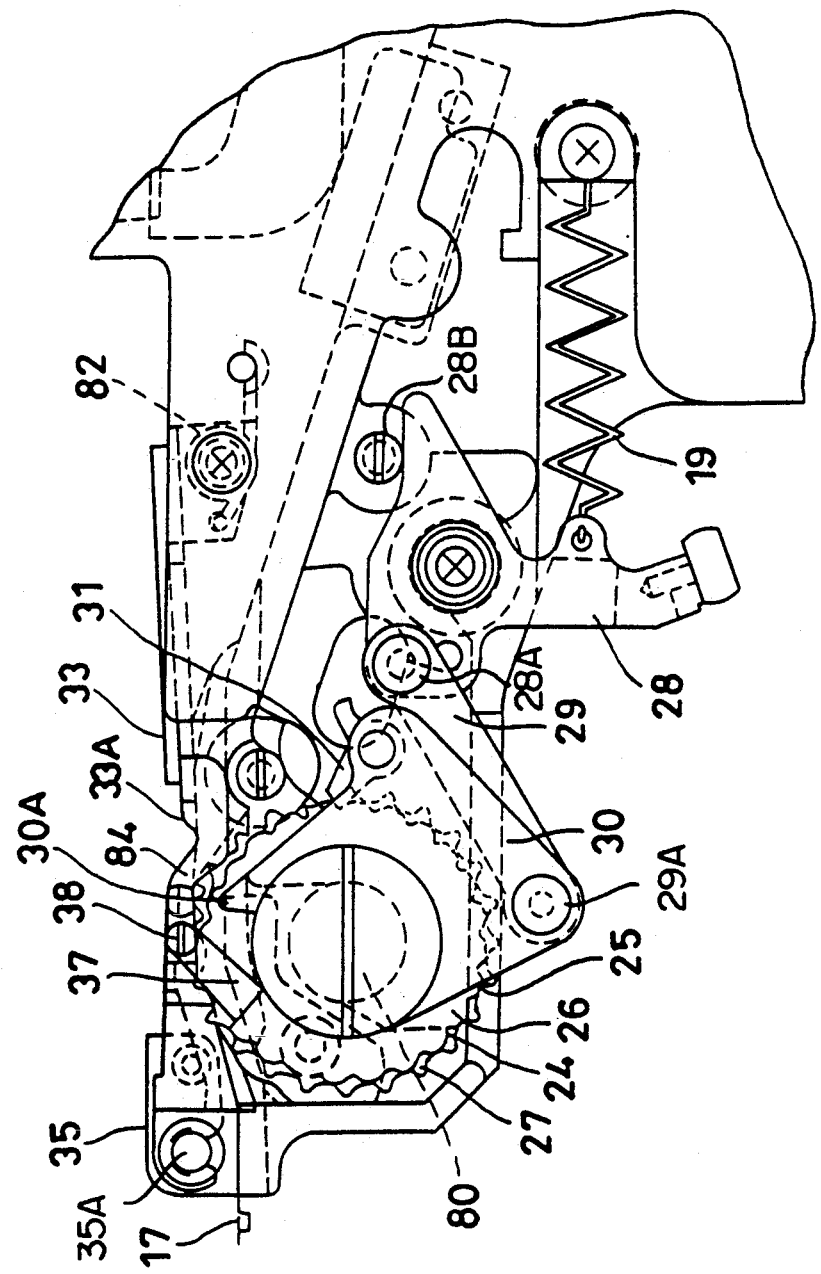
FIGS. 4 to 6 are respectively state views of tape feeding means.
Figure 5:
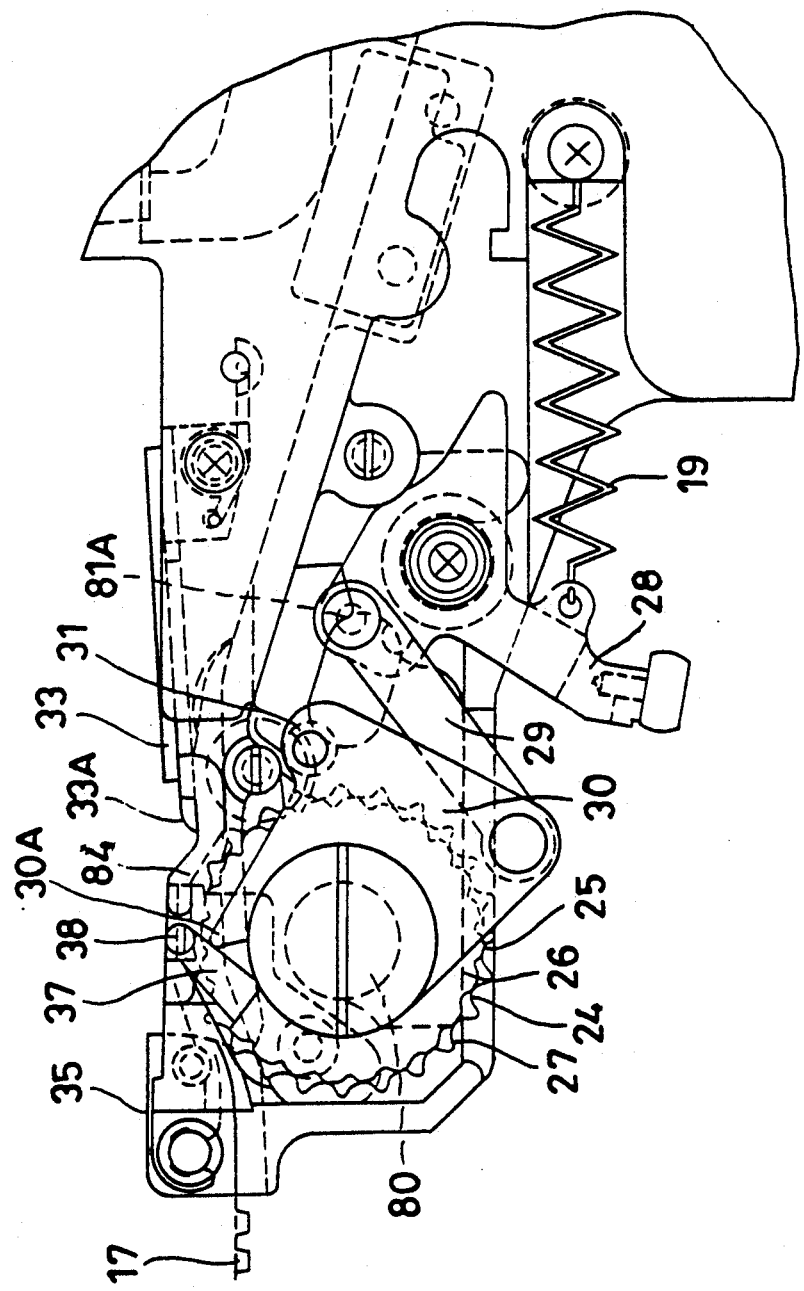

Preferred embodiments of the present invention will be described in greater detail with reference to the accompanying drawings.

Reference numeral 1 designates an apparatus for automatically mounting electronic parts to which the present invention is applied.

Reference numeral 2 designates a rotary disk intermittently rotated by a drive system not shown, which is provided in its undersurface with a plurality of attraction nozzles 4 as removing means which remove chip-like electronic parts (W) (hereinafter referred to as chipped parts (W)) from a tape feeder 3 to attract and feed them.

Reference numeral 5 designates a locating device in which when the chipped parts (W) is attracted by the attraction nozzle 4, the center of the chipped parts (W) is made to register with that of the nozzle 4 and the chipped parts (W) is rotated according to the mounting direction of a print substrate (P). A plurality of locating units are provided so as to correspond to sizes of parts as disclosed in U.S. Pat. No. 4,905,370 filed by the present applicant.

Reference numeral 6 designates an X-Y table on which the print substrate (P) is placed, the X-Y table being controlled in locating and movement in directions of X and Y axes.

Reference numerals 7 and 8 designate a first conveyor for supplying and feeding the print substrate (P) onto the X-Y table 6 and a second conveyor for discharging and feeding the print substrate (P) after mounting of the chipped parts thereon on the X-Y table 6, respectively.

Reference numeral 9 designates a carrier device for feeding the print substrate (P) on the first conveyor 7 onto the X-Y table 6 and feeding the print substrate (P) on the X-Y table 6 onto the second conveyor 8.

Reference numeral 10 designates a parts supply bed having a number of said tape feeders 3 juxtaposed thereon, said feeders 3 being provided on a base bed 1A of the apparatus for automatically mounting electronic parts 1. The parts supply bed is provided on a support bed 11 movably in a lateral direction in FIG. Z (in a longitudinal direction of the base bed 1A) through a linear guide 12 and a linear guide bearing 13. Support pins 14 and 15 provided at the lower part of the tape feeder 3 are provided in the state located to mounting holes made in the parts supply bed 10.

Reference numerals 16 and 16 designate laying plates for adjusting the height of the tape feeder 3 to correct a change in attraction position (height) resulting from the difference in kinds of tapes 17 later described.

Reference numeral 17 designates an embossed tape for storing the chipped parts (W) into square holes 17B arranged in a predetermined pitch spaced relation in a longitudinal direction of a base tape 17A, said square holes 17B having their openings closed by a cover tape 18. A feed hole 17E in engagement with a projection 27 of a sprocket 24 later described is provided in one collar 17C of collars 17C and 17D provided in a longitudinal direction.

Reference numeral 20 designates a tape reel mounting plate on which is mounted a tape reel 21 on which the tape 17 with the chipped parts (W) received therein, said tape reel mounting plate being mounted on said tape feeder 3 through fixed pins 22 and 23.

Reference numeral 24 designates a sprocket as a tape feed means which is provided coaxial with a ratchet gear 26 having a feed tooth 25 and having a projection 27. A swinging arm 28 is swung from the state where it is defined from its oscillation by a stopper 28B against the bias force of a spring 19 by a drive means not shown provided on the side of the apparatus for automatically mounting electronic parts, said oscillation being transmitted to a link 29 having one end mounted through a mounting hole 81A provided in the swinging arm 28 and a support shaft 28A and a swinging plate 30 having the other end of said link 29 mounted through a support shaft 29A. The sprocket 24 is rotated at a predetermined pitch by a ratchet pawl 31 meshed with said feed tooth 25 rotatably supported on the back of the swinging plate 30.

Reference numeral 80 designates a one-way clutch for preventing the sprocket 24 from being rotated reversely.

In the case where the feed pitch of the tape 17 is changed according to the sizes of the chipped parts (W), it can be done by replacing it with a ratchet gear 26 which is different in pitch of the feed tooth 25. Since at that time, the meshing position of the ratchet pawl 31 of the swinging plate 30 with the feed tooth 25 is changed, it is necessary to change the mounting position of the link 29 to the swinging arm 28. The link 29 is mounted through a further mounting hole 81B provided on the swinging arm 28.

Figure 8:
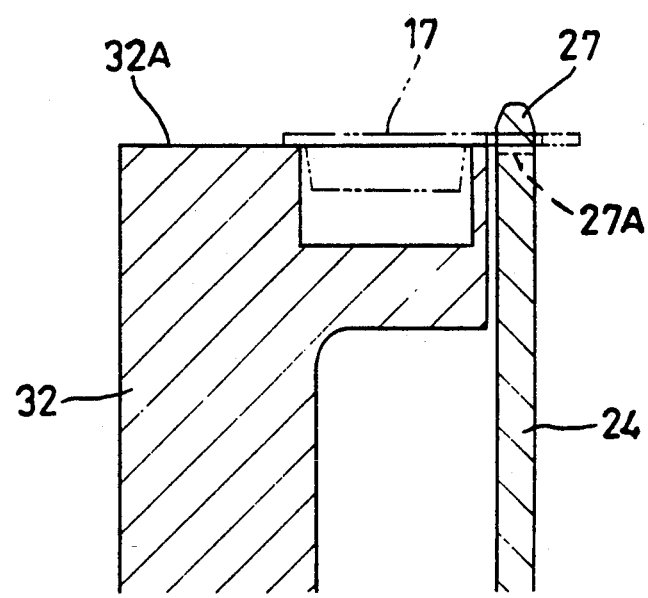
FIG. 8 is a sectional view of a chute.

Reference numeral 32 designates a chute as a guide member for guiding the tape 17 drawn out of the tape reel 21 to a parts removing position T by the attraction nozzle 4. An upper surface 32A of the chute 32 is set to be higher than a root 27A of the projection 27 of the sprocket 24 as shown in FIG. 8 so that only the projection 27 is projected from the upper surface 32A of the chute 32 and the lower surface of the tape 17 is placed in close contact with the chute 32, as a consequence of which the extreme end of the projection 27 is completed fitted into the feed hole 17E.

Reference numeral 33 designates a suppressor which suppresses the tape 17 guided by the chute 32 while being urged by a torsion spring 82 on this side of the parts removing position T. The cover tape 18 released from the tape 17 about an extreme end 33A of the suppressor 33 is wound about a peeling reel 34 made of synthetic resin.

Reference numeral 35 designates a front cover as a keep member which is rotable about a support shaft 35A to keep the tape 17 released from the cover tape 18, the front cover 35 being urged by a spring 36 in a direction of keeping the tape 17. A locking portion 84 provided on the suppressor is overhung above the front cover 35.

Reference 37 designates a stopper as a stopper member for holding the front cover 35 and the suppressor 33 in their raised state when the tape 17 is set. The stopper is supported in its one end on the front cover 35 rotatably through a shaft 38 and is stood upright on the outer peripheral surface of the swinging plate 30 when the front cover 35 is raised. A stopper contact portion 30A as a release means provided on the swinging plate 30 is placed in contact with the stopper 37 with the rotation of the swinging plate 30 by swinging the swinging arm 28 after the tape 17 has been set, whereby the stopper 37 in its upright state is fallen.

Reference numeral 39 designates a cover tape peeling device for winding on the peeling reel 34 the peeled cover tape 18 which is turned back about the extreme end 33A of the suppressor 33.

The construction of the peeling reel 34 will be described hereinafter.

Figure 9:
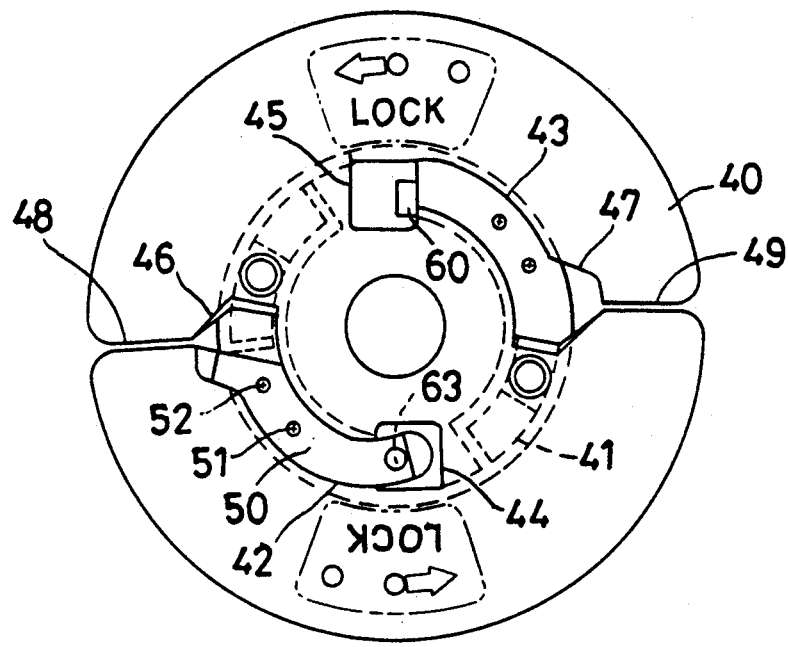
FIG. 9 is a view showing a reel socket plate of a peeling reel.

In FIG. 9, reference numeral 40 designates a reel socket plate as a second reel of a dough-nut shaped disk, and a reel socket portion 41 about which the concentrically and circularly peeled cover taper 18 is wound is stood upright in a substantially central portion between the center and the outer peripheral circle.

Reference numerals 42 and 43 designate depressions relatively provided in the surface of the reel socket plate 40, one ends 44 and 45 of which are cut, and the other ends 46 and 47 of which are partly cut in the outside of the reel socket portion. The other ends 46 and 47 are provided with slits 48 and 49 radially directed at the outer diameter of the reel socket plate 40.

Reference numeral 50 designates a cover tape holding plate as a keep member in the form of a plate spring which is inserted into the depression 42 and screwed at 51 and 52. The end of the pre-peeled cover tape 18 is taken outwardly through the slit 48 between the reel socket plate 40 and a reel drive 53 later described, the cover tape 18 being held between the reel socket portion 41 and the back of the cover tape holding plate 50 and the end thereof being taken outwardly of the reel socket plate 40 through the other end 46.

Figure 10:
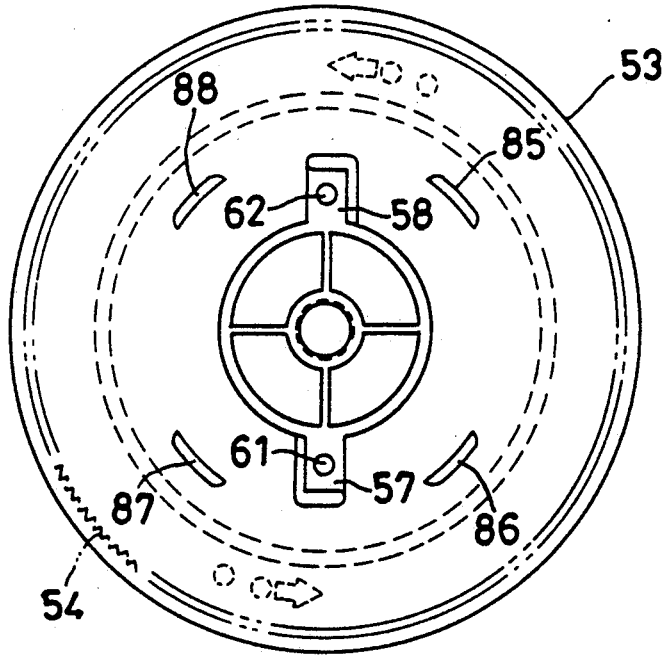
FIG. 10 is a view showing a reel drive.
Figure 11:
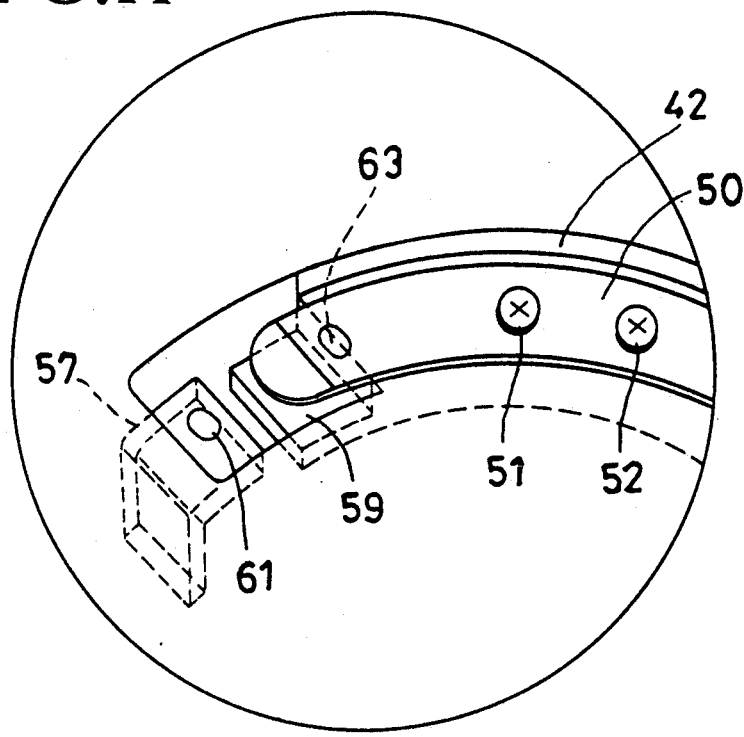
FIGS. 11 and 12 are respectively views showing the operation of fitting between the reel socket plate and the reel drive.

In FIG. 10, reference numeral 53 designates a reel drive as a first reel body opposed to the reel socket plate 40 wherein a ratchet gear 54 is formed on an offset portion in the vicinity of the outer diameter of the back. The reel drive 53 is inserted into a shaft 55 as a first shaft stopped at the base 3A of the tape feeder 3 by means of a screw 55A and rotatably mounted by a stop 56. It is noted that stop portions 57 and 58 provided in the reel drive 53 and insert portions 59 and 60 provided in the reel socket 41 are fitted together whereby the reel socket plate 40 and the reel drive 53 are fixed (see FIGS. 11 and 12).

Reference numerals 85, 86, 87 and 88 designate cover-tape removing projections stood upright on the reel drive 53 so that they may come into contact with the outer diameter portion of the reel socket portion 41 when the reel socket plate 40 and the reel drive 53 are fitted together. The cover tape 18 is wound about the reel socket portion 41 from the projections 85, 86, 87 and 88. Accordingly, by the twisting operation of the reel socket plate 40 and the reel drive 53 at the time of releasing the fitting therebetween after termination of the winding, the cover tape 18 wound about the reel socket portion 41 becomes loosened and may be easily removed. Its usefulness is remarkable when an adhesive tape is used.

When the reel drive 53 is removed from the reel socket 40, a space is formed through a portion of the projections 85, 86, 87 and 88 between the reel socket portion 41 and the cover tape 18. Therefore, the cover tape 18 may be easily removed from the reel socket portion 41.

The stop portions 57 and 58 are provided with convex portions 61 and 61 as the first fitting portions so as to free from a play between the reel socket plate 40 and the reel drive 53 at the time of fitting as described above. The convex portion 61 is held by the concave portion 63 as the second fitting portion provided inwardly so as to cover the convex portion 61 in the cover tape holding plate 50. That is, the reel socket plate 40 is likewise inserted into the shaft 55 with respect to the reel drive 53 mounted on the base 3A of the tape feeder 3, and thereafter, the reel socket plate 40 and the reel drive 53 are rotated in the opposite direction whereby the stop portions 57 and 58 and the insert portions 59 and 60 are fitted together. The convex portion 61 is moved into the concave portion 63 whereby the cover tape holding plate 50 and the reel drive 53 is urged by the bias force of the cover tape holding plate 50 in a direction of moving away from each other.

Next, the cover tape peeling device 39 for peeling the cover tape 18 at a predetermined pitch to wind it about the peeling reel 34 will be described below.

Reference numeral 64 designates a drive arm as a second arm for rotating the peeling reel 34. A range of clockwise rotation of the drive arm 64 about the support shaft 89 as the second shaft is defined by a spring 65 for a stopper shaft as a guide member screwed to the base 3A through a slot 66 bored in the drive arm 64, the range of counterclockwise rotation being defined by a stopper 65A secured to the base 3A.

Reference numeral 67 designates a return spring having one end secured to the drive arm 64 and the other end secured to the base 3A, the return spring 67 being biased in a direction opposite to the rotational direction of the drive arm 64 into contact with the stopper 65A.

Figure 14:
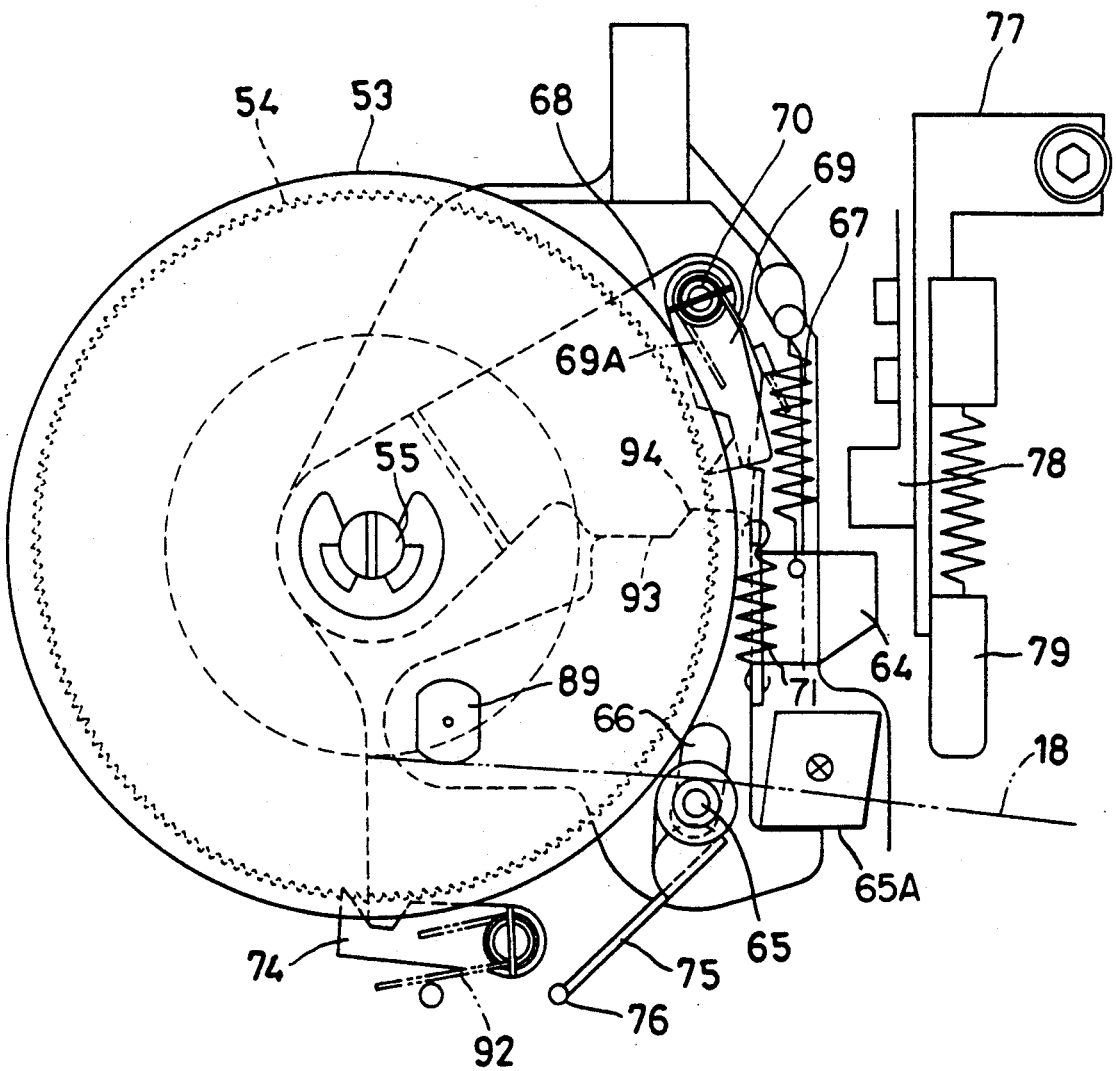
FIGS. 14 and 15 are respectively operating views of the peeling reel.
Figure 15:
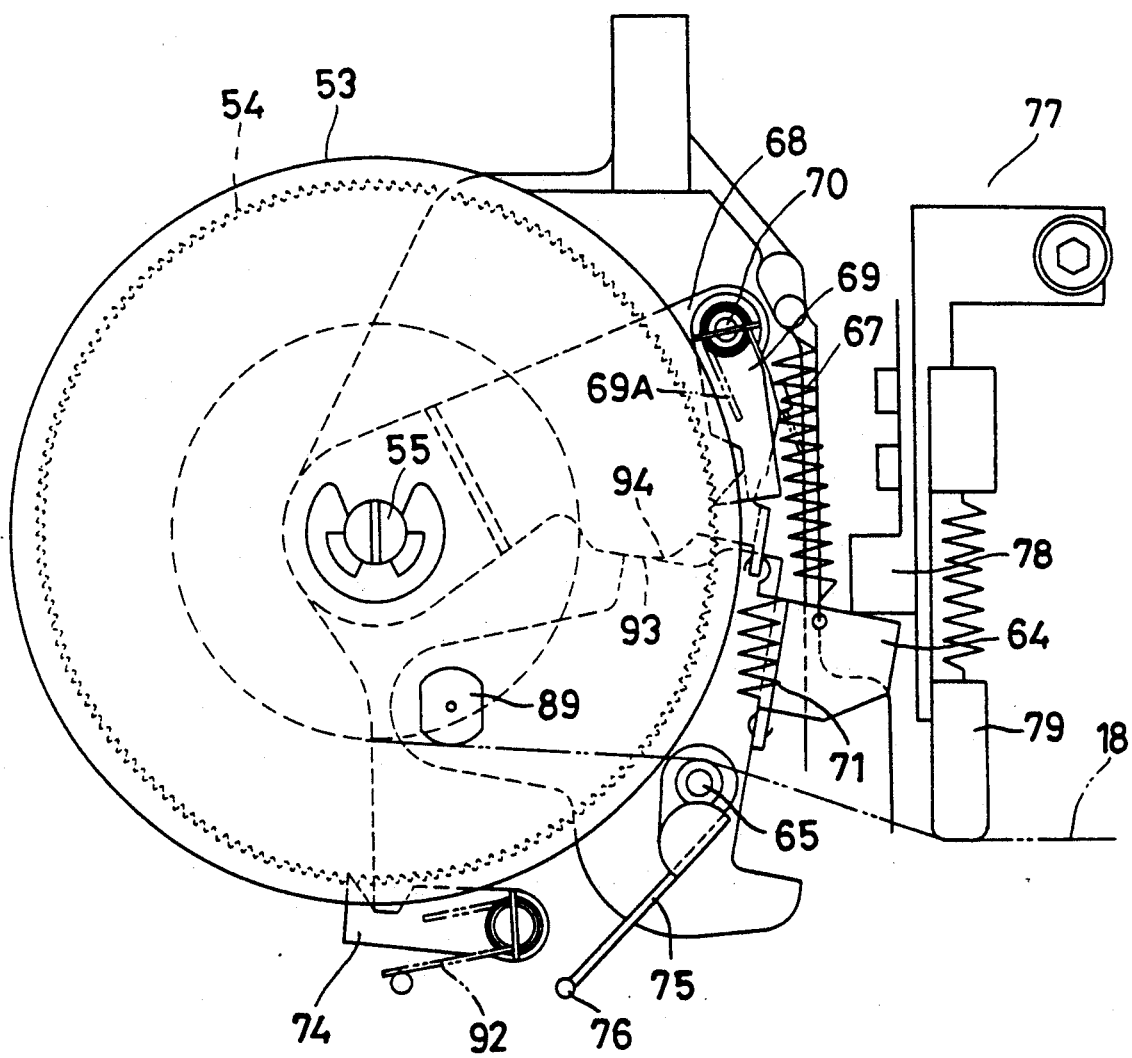
Figure 16:
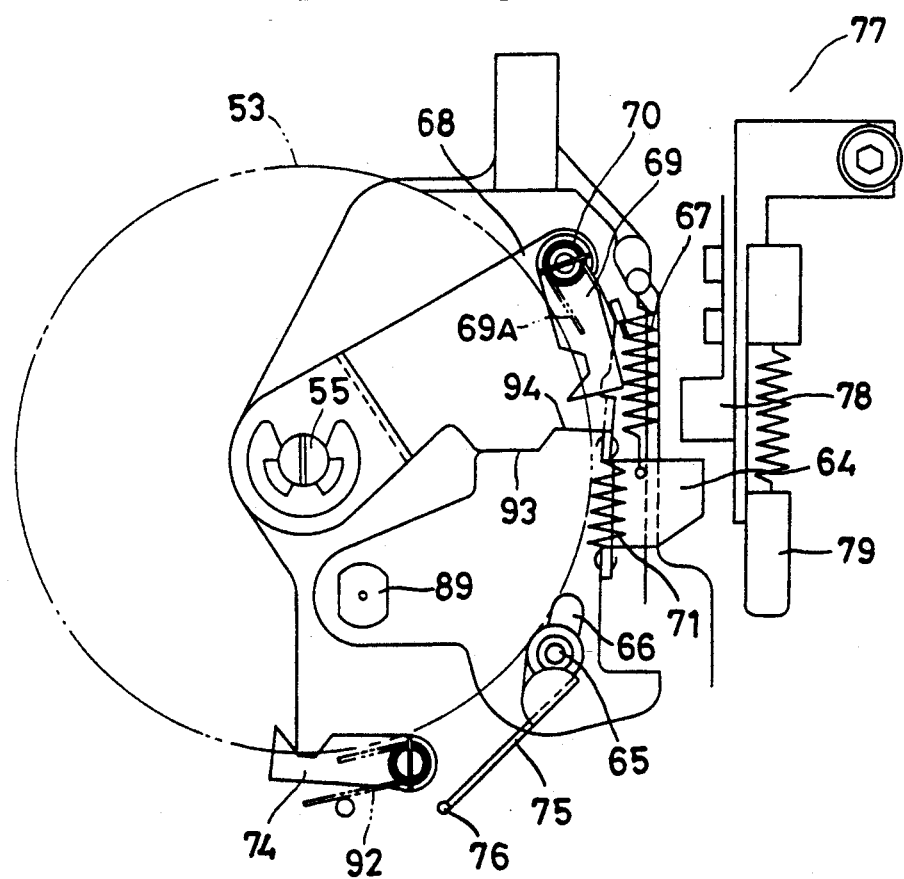
FIGS. 16 to 19 are respectively views showing the difference of a profile of a cam portion of an arm with a ratchet.
Figure 17:
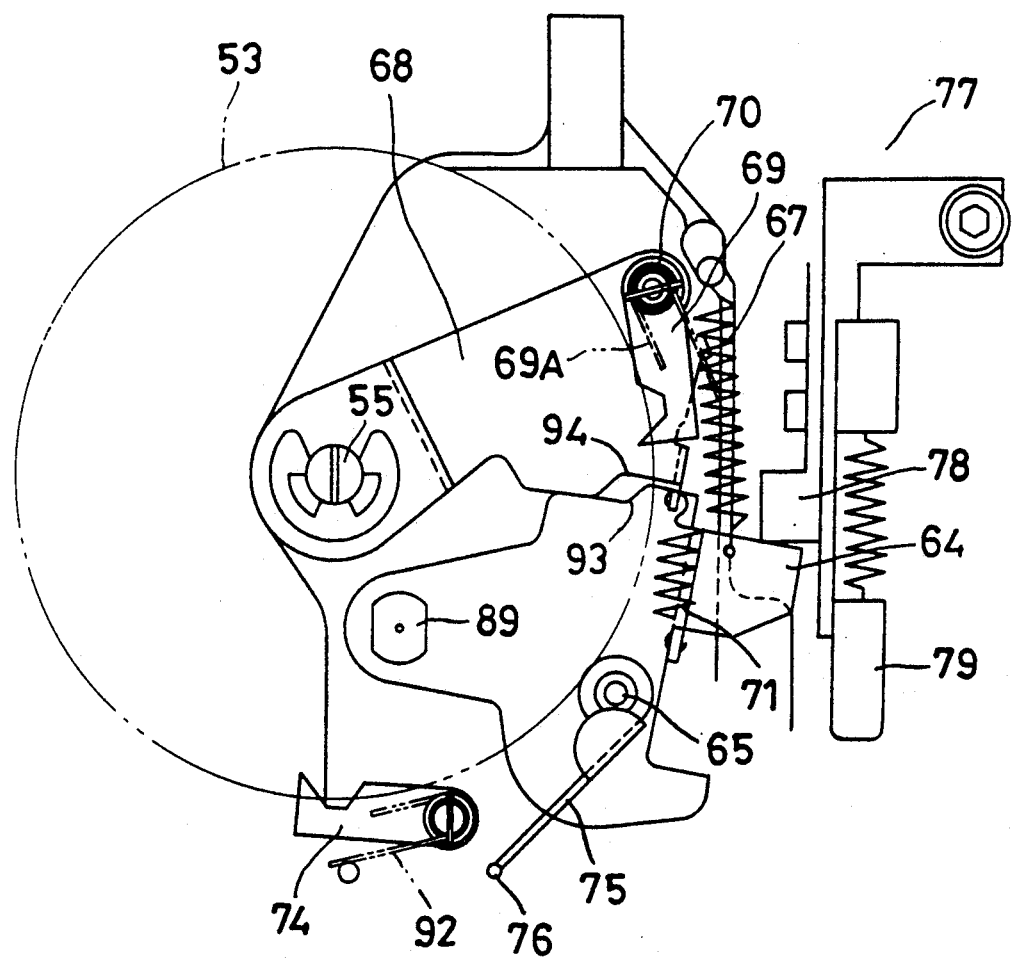

Reference numeral 68 designates an arm with a ratchet as a first arm in which a ratchet 69 rotatably mounted on the shaft 55 and meshed with the ratchet gear 54 is screwed at 70. A cam portion 94 of the arm with a ratchet 68 placed in contact with a cam portion 93 of the drive arm 64 as shown in FIGS. 14 and 16 is rotated while being slidably moved as shown in FIG. 17 with the rotation of the drive arm 64 by means of a spring 71 as a bias body having one end secured to the arm 68 with a ratchet and the other end secured to the drive arm 64. Accordingly, by rotation of the arm with a ratchet 68, the ratchet 69 moves and the reel drive 53, namely, the peeling reel 34 is rotated clockwise at a predetermined pitch through the ratchet gear 54. The ratchet 69 is urged against the ratchet gear by means of a spring 69A.

As the amount of the cover tape 18 wound about the peeling reel 34 increases, the diameter of the cover tape 18 wound increases. Therefore, unless the rotational angle of the peeling reel 34 caused by the ratchet 69 remains unchanged, the winding amount increases and the cover tape 18 gradually increases in tension and is sometimes cut.

However, by the balance between the bias force of the spring 71 and the force of the peeling reel 34 being returned in a counterclockwise direction, the rotational angle of the peeling reel 34 caused by the ratchet 69 gradually decreases, and therefore, the winding amount can be made substantially constant and the tension of the cover tape is maintained substantially constant, thus carrying out winding without occurrence of excessive looseness and high tension.

Figure 18:
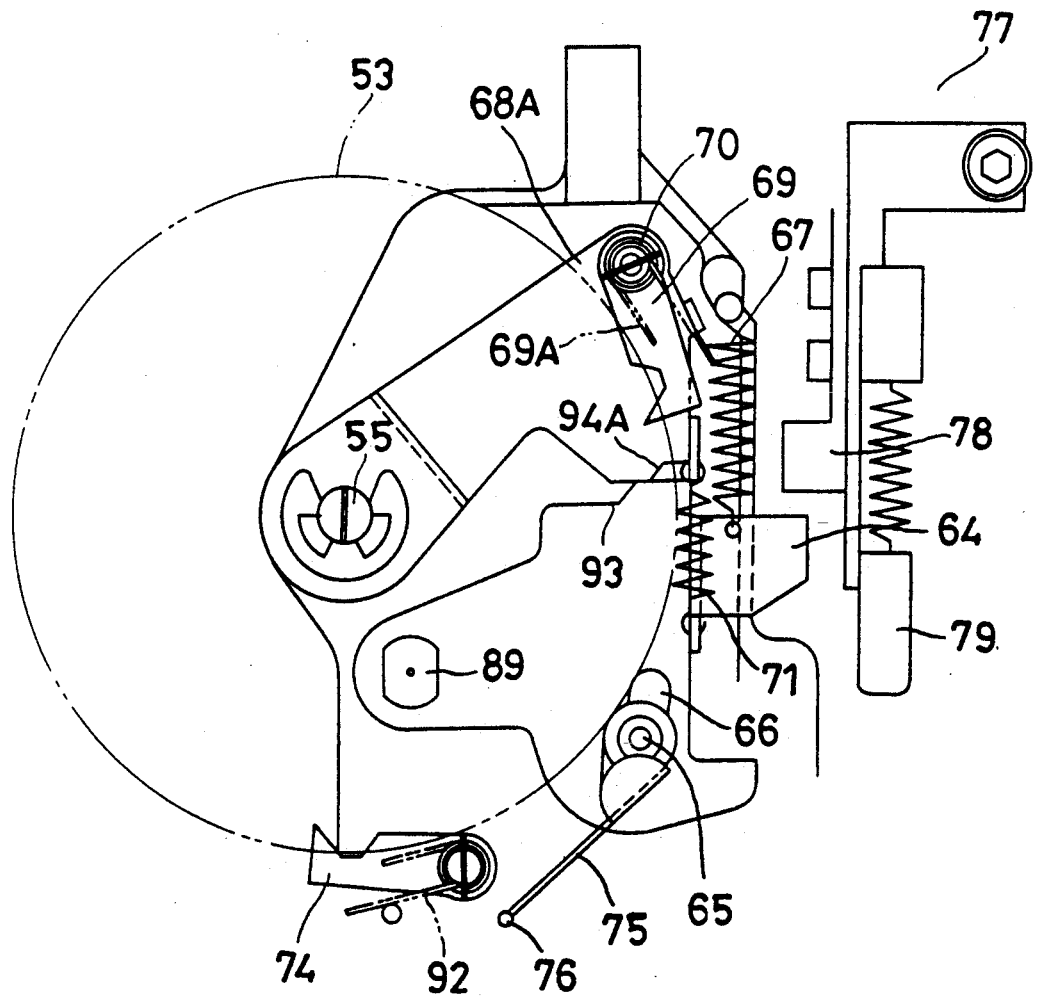
Figure 19:
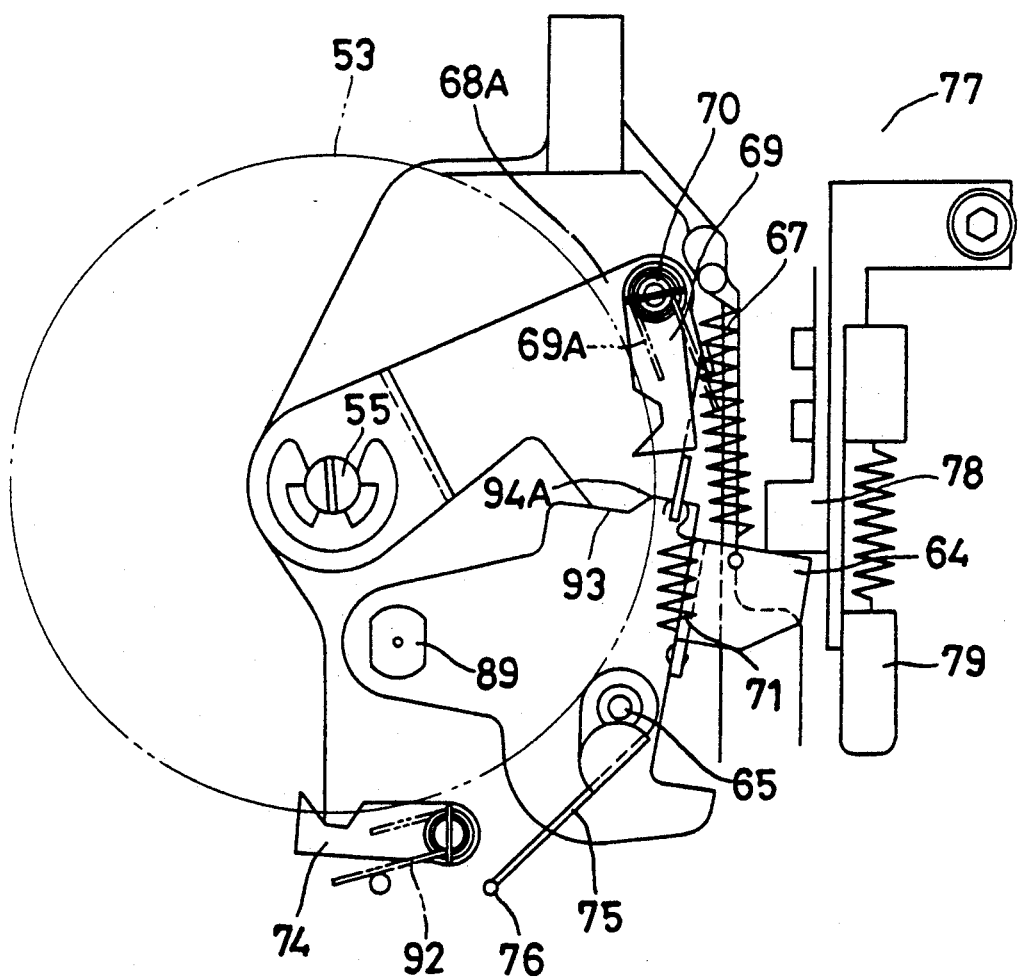

As previously mentioned, in the case where the feed pitch of the tape 17 is changed according to the sizes of the chipped parts (W), it is also necessary to change the winding pitch of the cover tape 18 accordingly. That is, by changing the aforementioned arm with a ratchet 68 to the arm 68A with a ratchet having a cam portion 94A different in cam profile as shown in FIG. 18, the arm with a ratchet 68A is rotated while the cam portion 94A is slidably moved on the cam portion 93 of the drive arm 64.

The contact surface between the base 3A and the arm with a ratchet 68 is coated with a silicone grease as a viscous material in order to prevent the peeling reel 34 from overrun due to the inertia force when the arm with a ratchet 68 rotates, and a load is applied by said viscosity during rotation. It is noted that the viscous load increases proportional to the rotational speed of the arm with a ratchet 68. Accordingly, operation is made so that the inertia force is negated according to each rotational speed.

Figure 20:
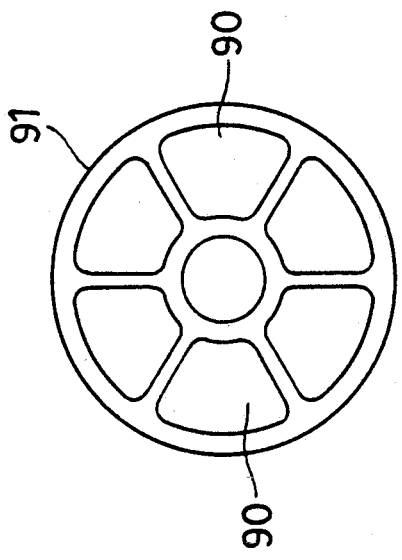
FIG. 20 is a plan view of a washer coated with silicone grease.
Figure 21:
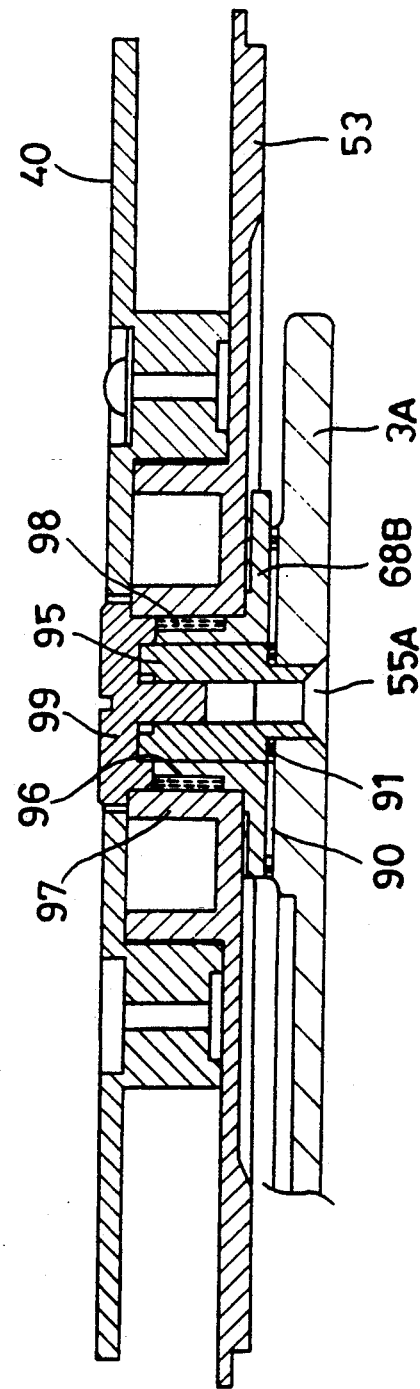
FIG. 21 is a view showing a state where the washer is inserted into a shaft.

Alternatively, in order to maintain the silicone grease at that position for a long period of time, a washer 91 radially having a grease storage portion 90 as a viscous material storage portion as shown in FIG. 20 is fitted between the base 3A and the arm with a ratchet 68B as shown in FIG. 21 to prevent a drip of the silicone grease. The arm with a ratchet 68B is different in construction from the arm with a ratchet 68 in order to place the washer 91 in close contact with the base 3A. That is, the arm with a ratchet 68B has an upright engaging portion 96 to be fitted into an upright shaft 95 screwed at 55A to the base 3A, and a spring 98 is inserted into a notch 97 in the outer peripheral portion of the engaging portion 96 so that a spring 98 functions in a direction of pressing the washer 91 against the base 3A and is stopped by a screw 99 from the top.

Figure 22:
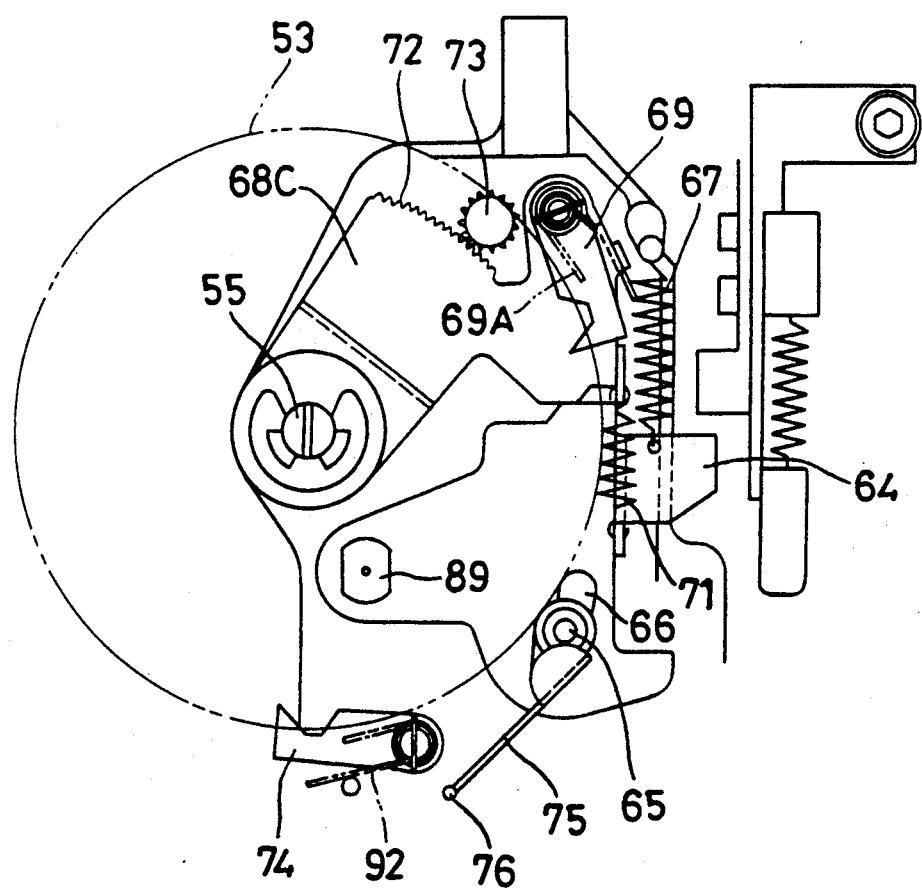
FIG. 22 is a view showing another embodiment of the peeling reel.

Furthermore, alternatively, a gear tooth 72 is provided on an arm with a ratchet 68C as shown in FIG. 22, and an idle gear 73 supported on the base 3A is rotated without load whereby the peeling reel 34 is prevented from being overrun caused by the inertia force. That is, the turning force for rotating the idle gear 73 is made greater than the inertia force to thereby negate the inertia force. At that time, if the idle gear 73 is coated with the silicone grease, the braking force can be enhanced to expect greater effect.

Reference numeral 74 designates a ratchet stopper urged against the peeling reel 34, the ratchet stoper 74 being engaged with the ratchet gear 54 after rotational operation to define the rotation of the peeling reel 34 to prevent reversal.

Reference numeral 77 designates a hammer mechanism provided on the side of the apparatus for automatically mounting electronic parts 1 and vertically moved by a drive source not shown, which comprises an arm contact portion 78 as an arm push-down member and a cover tape contact portion 79. The arm contact portion 78 comes into contact with the drive arm 64 to push it down to rotate the peeling reel 34. When the cover tape is peeled off, the cover tape contact portion 79 comes into contact with the turned back surface of the cover tape 18 to push down the cover tape 18 while urging against the extreme end 33A of the suppressor 33 and the screw 65 for a stopper shaft to give a looseness before delivery of the next tape 17 to the cover tape 18. It is noted that the screw for a stopper shaft 65 serves as a base point when the looseness is provided in the cover tape 18.

Next, the configuration will be described to prevent an error resulting from an operator's careless operation such that when the cover tape 18 is wound in advance about the peeling reel 34 the cover tape 18 is wound about the peeling reel 34 passing below instead of above the screw for a stopper shaft 65 which serves as a base point for providing a looseness in the cover tape 18.

Reference numeral 75 designates a cover tape guard as a guard member for guiding the aforementioned cover tape 18 when the latter is wound about the peeling reel 34 by the operator. The cover tape guard 75 has one end having a ⌐-shape in section, whose lower side is stopped at the base 3A by the screw for a stopper shaft 65, and the other end inserted into and located at a hole 76 provided in the base 3A below the screw for a stopper shaft 65. This prevents the operator's erroneous operation in which the cover tape 18 is wound about the peeling reel 34 passing below the screw for a stopper shaft 65. Alternatively, the screw for a stopper shaft 65 is formed integral with the cover tape guard 75.

The tape 17 becomes plastically deformed since it is wound about and received in the tape reel 21 (The tape drawn out of the tape reel 21 is approximately measured by the operator partly from the outer diameter to the inner diameter of the tape reel 21. It was a curved surface having the radius from 200 mm to 40 mm.). Even if the tape is drawn out of the tape reel 21, a permanent strain remains. If the chute 32 is horizontal, the tape 17 is floated With respect to the chute surface at a parts removing position due to the influence of the permanent strain and becomes difficult to be attracted. So, the tape is held by the suppressor 33 and the front cover 35 provided before and after the parts removing position. However, it requires a considerable pressing force till it is completely held. When the pressing force is applied to the tape 17, the load is excessively applied when the tape is delivered, and proper tape delivery operation cannot be effected. Therefore, excessively strong pressing force cannot be set. On the other hand, the radius of a tape (17) winding portion of the tape reel 21 is set to 25 mm on the minimum in accordance with the Standard of Nihon Denshi Kikai Kogyo Kai. From the foregoing, it is effective to form the chute surface into a curved surface in the range of radius of 25 mm or more to radius of 200 mm or less about a certain point 0 (see FIG. 23) below the parts removing position in consideration of the permanent strain. So, in the present embodiment, the chute surface is formed into a curved surface having the radius of 100 mm.

The operation of the apparatus will be described hereinafter.

Figure 12:
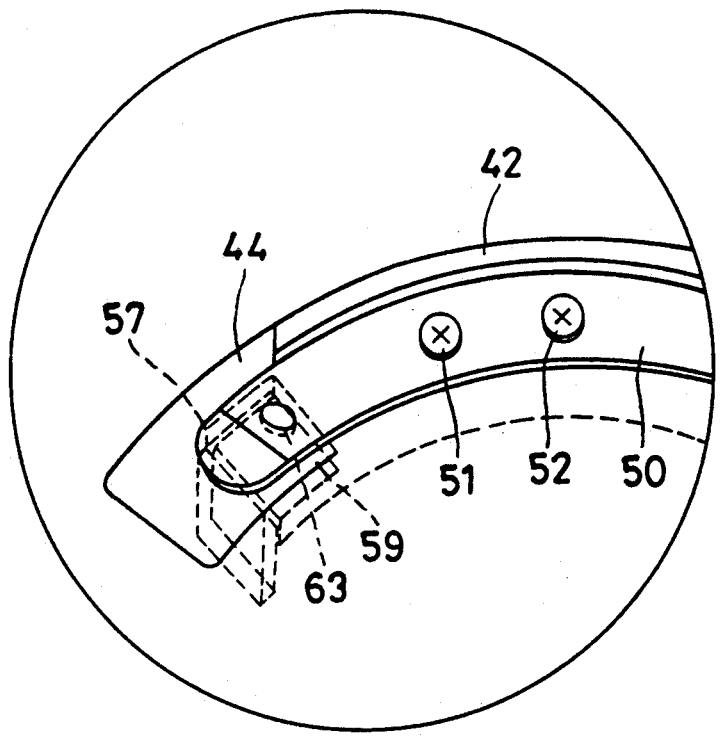

First, the insert portions 59 and 60 of the reel socket plate 40 are fitted into the stop portions 57 and 58 of the reel drive 53 secured to the base 3A to assemble the peeling reel 34. At this time, as shown in FIG. 12, the convex portion 61 of the stop portion 57 is superposed to the concave portion 63 provided in the cover tape holding plate 50 to give an operator an adequate clicking feeling. Accordingly, the operator can confirm if the fitting operation of the peeling reel 34 is adequately carried out.

Figure 6:
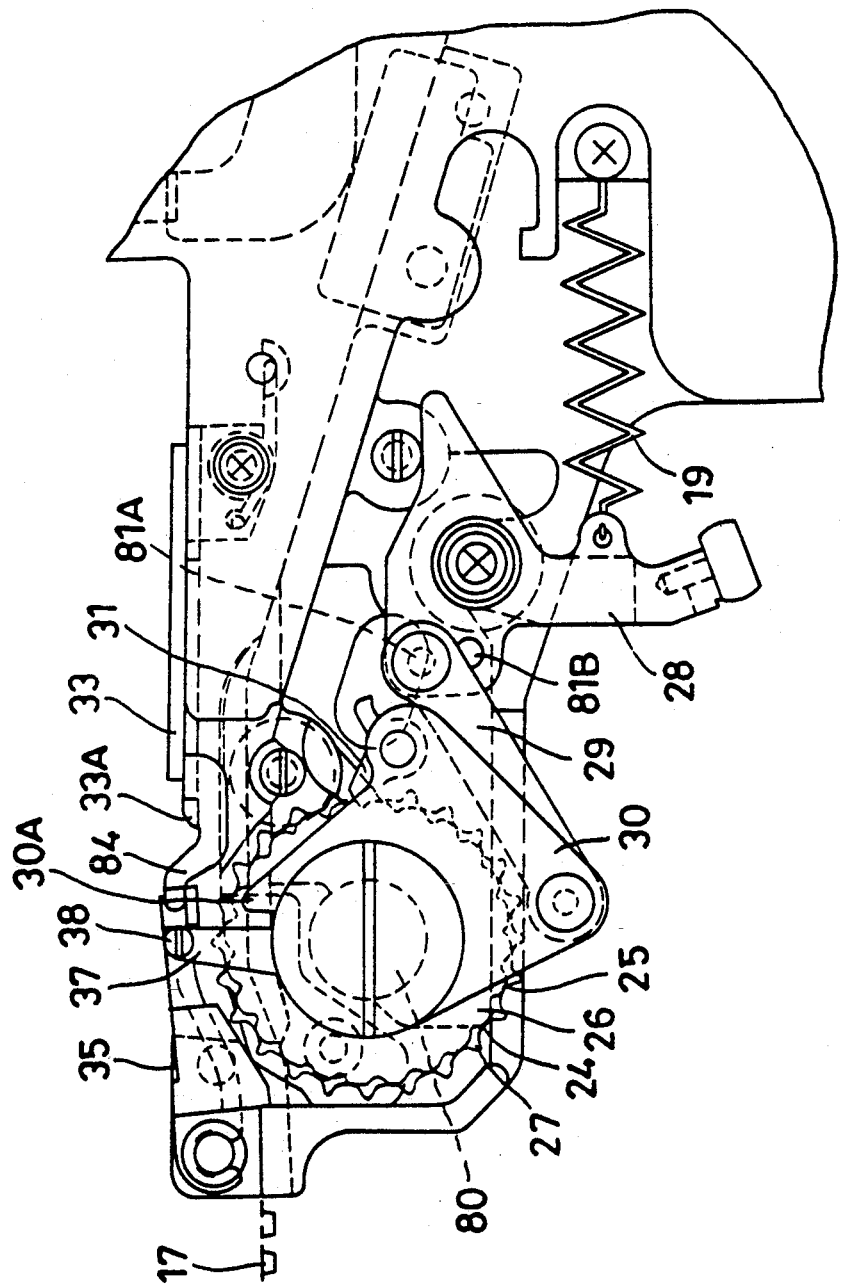

Next, as shown in FIG. 6, the stopper 37 is stood upright to raise the suppressor 33 and the front cover 35 against the bias forces of a torsional spring 82 and the spring 36, respectively, in which state the tape 17 is drawn out of the tape reel 34 mounted on the tape reel mounting plate 20 to set the tape 17 at a predetermined position. The cover tape 18 released from the tape 17 about the extreme end 33A of the suppressor 33 is carried toward the peeling reel 34 passing through the cover tape insert portion 33B of the suppressor 33. In the state where the cover tape contact portion 79 is moved down, the cover tape 18 is wound about the reel socket portion 41 of the peeling reel 34 passing above the screw for a stopper shaft 65 because of the presence of the cover tape guard 75 and drawn outside the reel socket plate 40 through the slit 48. Then, the extreme end of the cover tape 18 is held by the back of the cover tape holding plate 50.

Upon termination of the aforementioned operation, the swinging arm 28 causes to be swung to rotate the swinging plate 30. The stopper contact portion 30A is brought into contact with the stopper 37 to fall the stopper 37 to release the raised state of the suppressor 33 and the front cover 35. The tape 17 is held by the suppressor 33 and the front cover 35, thus terminating the setting of the tape 17 to the tape feeder 3.

Figure 7:
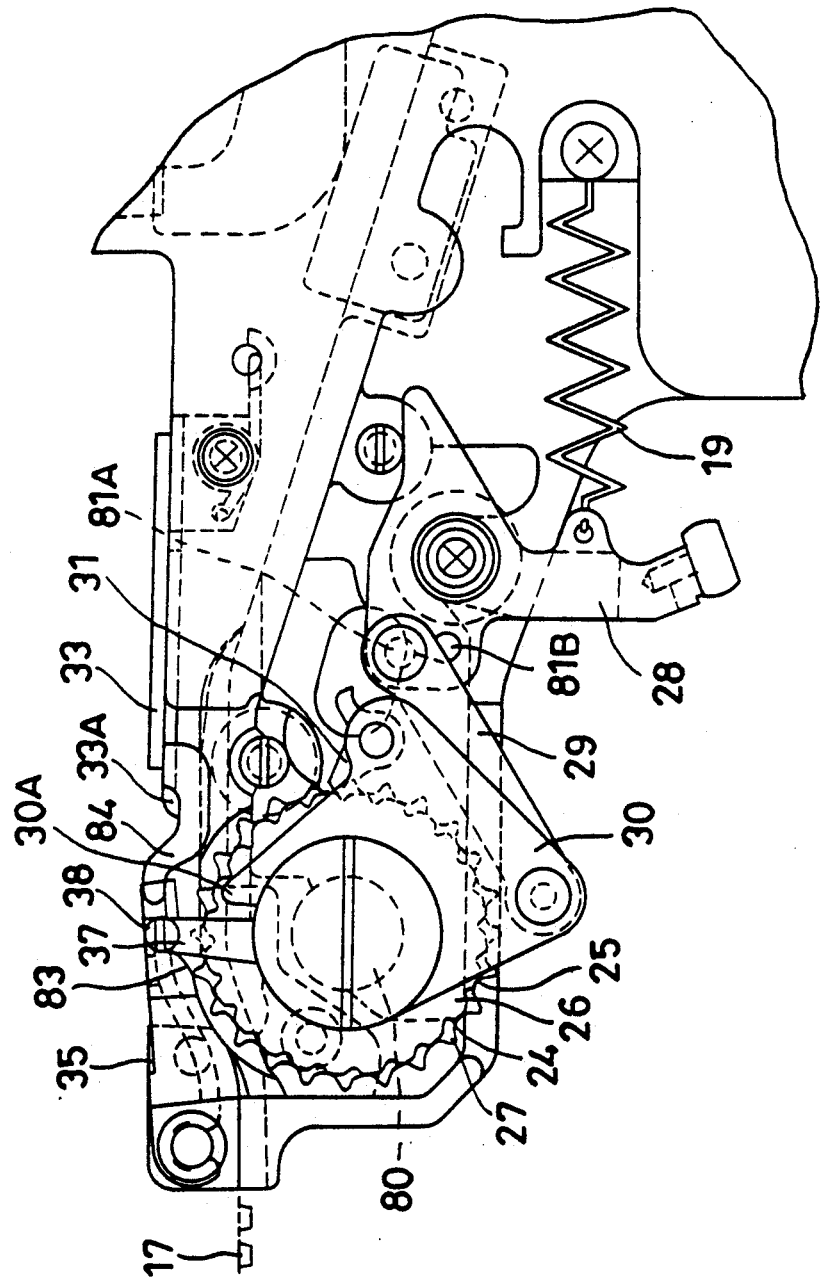
FIG. 7 is a view showing tape feeding means in another embodiment.

Alternatively, when the front cover 35 is raised by the bias force of a plate spring 83 placed in contact with the stopper 37 with a lower end thereof screwed to the bottom surface of the front cover 35 as shown in FIG. 7, as auxiliary means when the stopper 37 is stood upright, the stopper 37 is rotated about the shaft 38 to be stood upright on the outer peripheral surface of the swinging plate 30.

After plural kinds of the tape feeders 3 with the tape 17 set thereto have been placed on the parts supply bed 10, the parts mounting operation of the apparatus for automatically mounting electronic parts is started.

The parts supply bed 10 is horizontally moved to select the desired tape feeder 3, and the chipped parts (W) within the tape 17 is attracted and removed by the attraction nozzle 4.

During that period, the following operation is carried out.

Figure 23:
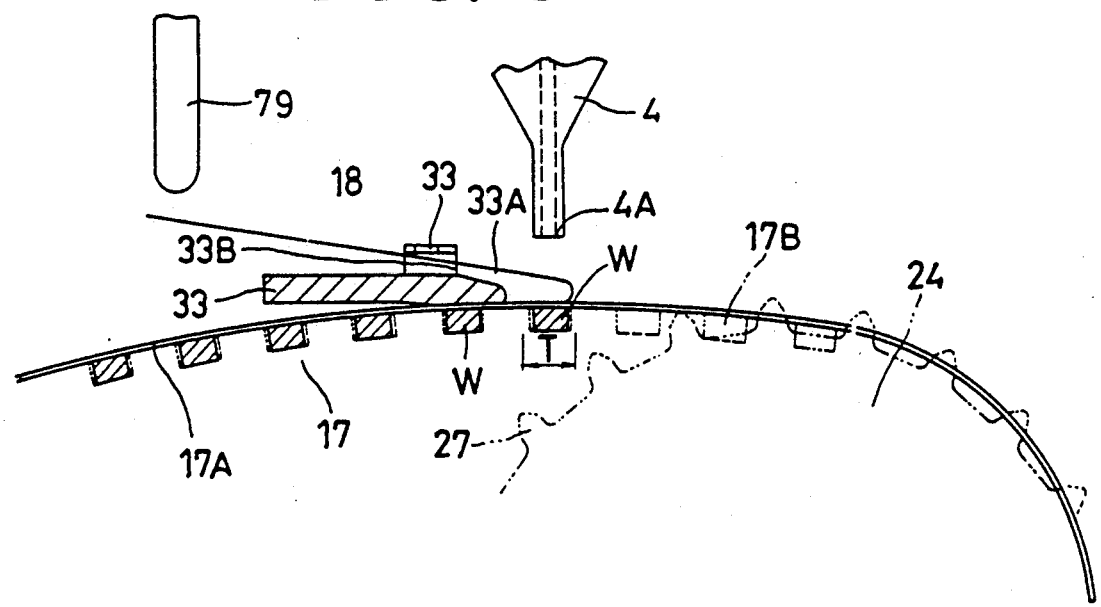
FIGS. 23 to 25 are respectively views showing the operation for removing chipped parts.
Figure 24:
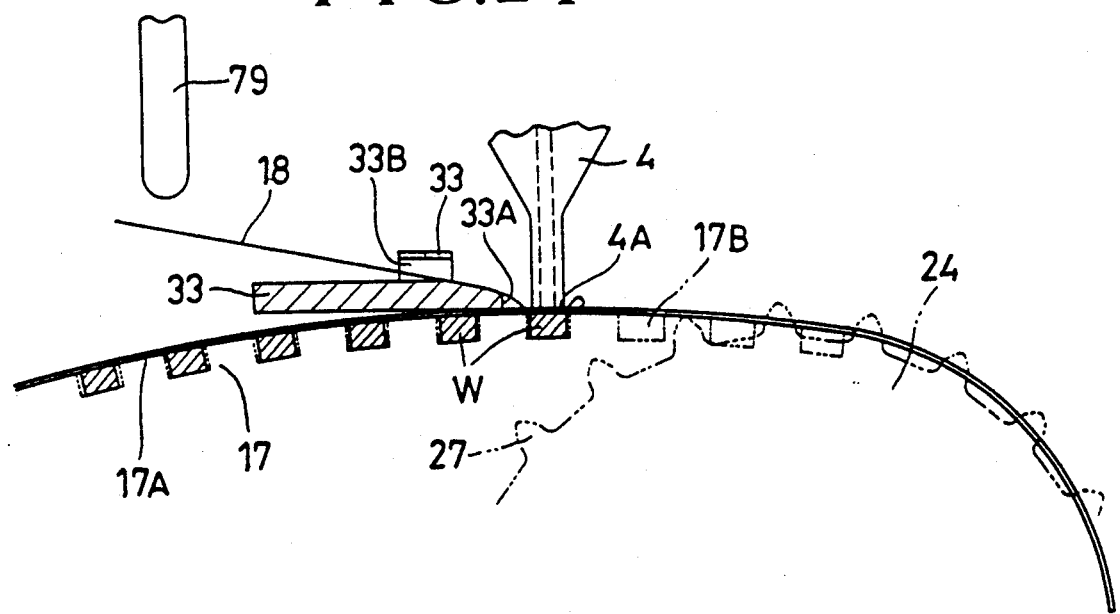

First, the swinging arm 28 is pulled by the drive means against the bias force of the spring 19, and the feed tooth 25 of the ratchet gear 26 is pushed by the ratchet pawl 31 through the link 29 and the swinging plate 30 to rotate the sprocket 24 at a predetermined pitch. Accordingly, the tape 17 is fed as the sprocket 24 is rotated by the projection 27 of the sprocket 24 moved into the feed hole 17E of the tape 17 whereby &he chipped parts (W) is fed to the parts removing position T positioned directly above the point 0 as shown in FIG. 23. At that time, the cover tape 18 is fed in the state where the former stays on the first chipped parts (W), and the suction nozzle 4 is moved down as shown in FIG. 24. The extreme end 4A of the nozzle 4 is moved close to and stopped at the cover tape 18 on the chipped parts (W).

Then, the hammer mechanism 77 is moved down by the drive source and the cover tape 18 is pressed down by the cover tape contact portion 79. The drive arm 64 is rotated by the arm contact portion 78 to feed the peeling reel 34 at a predetermined pitch. That is, the arm contact portion 78 is placed in contact with the drive arm 64 by the downward movement of the hammer mechanism 77 and is further moved downward whereby the drive arm 64 is rotated about the support shaft 89 at a predetermined pitch. With this, the arm with a ratchet 68 is pulled and rotated by the spring 71, and the peeling reel 34 fed at a predetermined pitch by the ratchet 69 through the ratchet gear 54. At that time, the inertia force of the arm with a ratchet 68 is restricted by the viscosity of the silicone oil coated on the contact surface between the base 3A and the arm with a ratchet 68.

In this manner, the cover tape 18 is torn off from the base tape 17A of the tape 17 to open the square hole 17B of the base tape 17A to expose the chipped parts W within the tape 17. At that time, since the chute surface is the curved surface having the radius of 100 mm about the point 0, the permanent strain of the tape 17 can be absorbed and an opening of the square hole 17B is spread. Since the extreme end 4A of the attraction nozzle 4 is positioned close to and upwardly of the square hole 17B, even if the chipped parts W is attracted to the back of the cover tape 18 with static electricity or the like, the chipped parts W is drawn by the extreme end 4A of the attraction nozzle 4 in the peeling operation of the cover tape 18 and is left within the square hole 17B.

Figure 25:
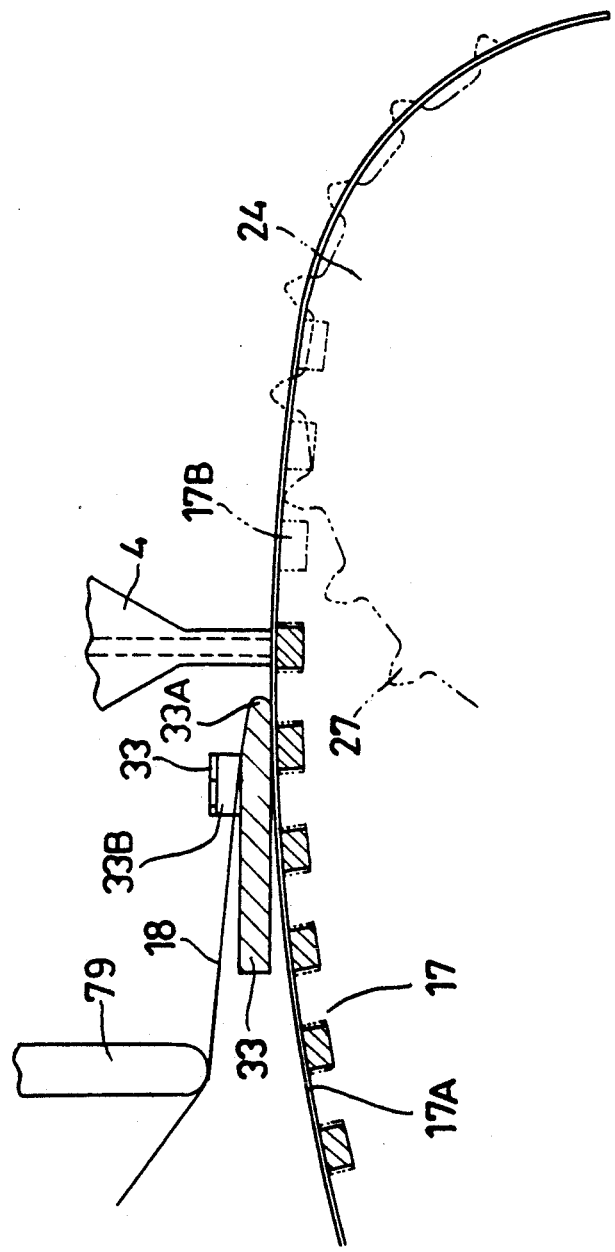

When the tape 17 is peeled off from the cover tape 18 as described above, the attraction nozzle 4 is again moved down as shown in FIG. 25, and the chipped parts W is pushed up by a push-up pin not shown so that the chipped parts W is attracted and retained at the extreme end 4A. Here, the chipped parts W is designed to be easily removed from the square hole 17B by the push-up pin. However, similar effect is obtained, for example, by the provision of a mechanism for vibrating the lower side of the square hole 17B.

Next, the chipped parts W is removed by the upward vertical movement of the attraction nozzle 4 and then placed on the print substrate P located on the X-Y table 6 by the rotation of the rotary disk 2. Then, the hammer mechanism 77 is moved upward to give a looseness of one pitch portion at the time of next feed to the cover tape 18, thus terminating the parts mounting operation for once.

Mounting of parts is thereafter sequentially carried out in a manner similar to the above.

Figure 13:
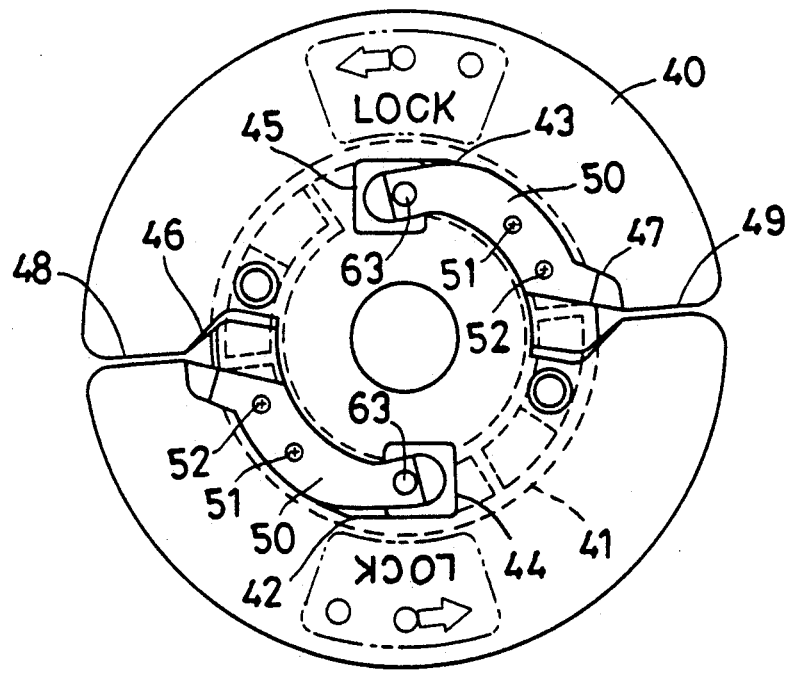
FIG. 13 is a view showing another embodiment of the reel socket plate.

In the case where the convex portion 61 becomes worn out because it is made of synthetic resin, as a result of which clicking feeling at the time of fitting disappears, a further convex portion 62 may be held by the concave portion 63. Moreover, the cover tape holding plate 50 may be mounted also on a further depression 43 as shown in FIG. 13.

In the case where the winding pitch is changed, the arm with a ratchet 68 is changed into the arm with a ratchet 68A having a cam portion 94A different in cam profile whereby the rotation of the peeling reel 34 having a different pitch may be performed by the rotation of the drive arm 64 having the same pitch caused by the arm contact portion 78.

As described above, according to the present invention, the width of the tape feeder can be narrowed, and the body of the apparatus for automatically mounting electronic parts can be miniaturized. Furthermore, the moving time from one tape feeder to the other during mounting of parts can be shortened. Moreover, the winding amount of the cover tape by the peeling reel can be made substantially constant, and the cover tape is not cut due to the excessive tension.

What is claimed is:

1. A cover-tape peeling apparatus for a tape feeder for peeling a cover tape released from a tape having a number of chip-like electronic parts sealed therein in a substantially equally spaced relation to wind and receive it into a peeling reel, the apparatus comprising:
    a first arm rotatably supported on a first shaft stood perpendicularly to a plane of a base of said tape feeder and having ratchet meshed with a gear tooth formed in the outer peripheral portion of said peeling reel;
    a second arm having a cam portion in engagement with a cam portion provided on said first arm and rotatably supported on a second shaft, an arm pushdown member in contact with said second arm to push down and rotate the second arm; and
    an urging body extended between both said arms and for rotating the first arm in response to the rotation of said second arm rotated by said arm push-down member so that said peeling reel is rotated by means of the ratchet whereby said cover tape is peeled from said tape having a number of chip-like electronic parts sealed therein.

* * * * *